United States Patent [19]
Iida et al.

[11] Patent Number: 5,459,011
[45] Date of Patent: Oct. 17, 1995

[54] LIQUID OR PASTE PHOTOSENSITIVE COMPOSITION CONTAING AROMATIC DIAZO COMPOUND AND LACTIC ACID, HYDROXYACETIC ACID OR MIXTURE THEREOF

[75] Inventors: Hirotada Iida; Kieko Harada; Katsuyo Tokuda, all of Funabashi, Japan

[73] Assignee: Toyo Gosei Kogyo Co., Ltd., Japan

[21] Appl. No.: 394,561

[22] Filed: Feb. 27, 1995

Related U.S. Application Data

[63] Continuation of Ser. No. 233,228, Apr. 26, 1994, abandoned, which is a continuation of Ser. No. 974,477, Nov. 12, 1992, abandoned.

[30] Foreign Application Priority Data

Nov. 19, 1991 [JP] Japan ................................ 3-303421

[51] Int. Cl.$^6$ ............................................. G03F 7/016
[52] U.S. Cl. .......................... 430/177; 430/171; 430/176
[58] Field of Search ................................ 430/151, 171, 430/175, 176, 177

[56] References Cited

U.S. PATENT DOCUMENTS

| | | | |
|---|---|---|---|
| 3,235,382 | 2/1966 | Neugebauer et al. | 430/171 |
| 3,867,147 | 2/1975 | Teuscher. | |
| 3,944,422 | 3/1976 | Nihyakumen et al. | 430/171 |

FOREIGN PATENT DOCUMENTS

| | | |
|---|---|---|
| 0066452 | 12/1982 | European Pat. Off. . |
| 0338786 | 10/1989 | European Pat. Off. . |

OTHER PUBLICATIONS

European Search Report (92 11 9735) EPA-32330.

Primary Examiner—Charles L. Bowers, Jr.
Assistant Examiner—Christopher G. Young
Attorney, Agent, or Firm—Jordan B. Bierman; Bierman and Muserlian

[57] ABSTRACT

A photosensitive composition including a water-soluble aromatic diazo compound having at least two diazo groups and lactic acid, hydroxyacetic acid or, a mixture thereof in an amount of at least one third by weight of the diazo compound. The photosensitive composition is in the form of a liquid or paste, is thus easy to handle, is suitable for use in the production of photosensitive printing plates, and has good storage stability.

4 Claims, No Drawings

LIQUID OR PASTE PHOTOSENSITIVE COMPOSITION CONTAING AROMATIC DIAZO COMPOUND AND LACTIC ACID, HYDROXYACETIC ACID OR MIXTURE THEREOF

This application is a continuation of application Ser. No. 08/233,228, filed Apr. 26, 1994, now abandoned, which is a continuation of application Ser. No. 07/974,477, filed Nov. 12, 1992, now abandoned.

FIELD OF THE INVENTION

This invention relates to a liquid or paste-formed diazo compound-containing a photosensitive composition which has good storage stability and is easy to handle, and to a photosensitive material having a photosensitive layer containing the above composition, e.g. a screen printing plate, a photosensitive colored image formation material, or the like.

BACKGROUND OF THE INVENTION

Aromatic diazo compounds having at least two diazo groups in the molecule (hereinafter referred to as "multifunctional diazo compounds") are industrially important as photosensitive agents for forming the photosensitive layer of materials such as lithographic printing plates, screen printing plates, color image formation materials and the like. Heretofore, such photosensitive agents typically uses a condensate (so-called diazo resin) of diphenylamine-4-diazonium salt (or 4-N-phenylaminobenzene diazonium salt) and formaldehyde as a typical compound. Production methods for such multifunctional diazo condensates are described in specifications of U.S. Pat. Nos. 2,679,498, 2,922,715, 2,946, 683, 3,050,502, 3,311,605, 3,163,633, 3,406,159, and 3,277, 074.

Thereafter, many patents on such multifunctional diazo compounds have been published. For example, Japanese Patent Publication 49-45323/1974 and Japanese Patent Publication Laid-open 62-156656/1987 propose the use of a special compound such as 4,4'-bismethoxymethyl-diphenylether as a condensation agent for diphenylamine-4-diazonium salt in place of formaldehyde. Furthermore, Japanese Patent Publication Laid-open 2-3049/1990 finds that hexamethoxy-methyl-melamine is satisfactory as such a special condensation agent.

In order to enhance the water solubility of multifunctional diazo compounds, Japanese Patent Publication 40-26623/1965, Japanese Patent Publication Laid-open 1-102457/1989, Japanese Patent Publication Laid-open 1-245246/1989, and Japanese Patent Publication Laid-open 3-163549/1991 describe the use of a carbonyl compound having carboxyl or sulfonic acid group in place of formaldehyde. Multifunctional diazo compounds described in the above patents have diphenylamine-4-diazonium salt as a basic structural unit, but multifunctional diazo compounds having 4-N,N-dialkylaminobenzene diazonium salt as a basic structural unit are also effective as photosensitive agents for use in photosensitive compositions. Typical patents on such compounds are Japanese Patent Publication 1-57332/1989 and Japanese Patent Application 153295/1991 (filed on Jun. 25, 1991).

As described above, a variety of multifunctional diazo compounds have heretofore been developed, and these compounds are broadly classified by applications into water-soluble diazo compounds and organic solvent-soluble diazo compounds. Water-soluble multifunctional diazo compounds are primarily used as photosensitive agents for use in screen printing plates and colored image formation material (e.g. color proof films), whereas organic solvent-soluble diazo compounds are often used for lithographic printing plates.

Water-soluble multifunctional diazo compounds present the following two common important problems that have yet to be solved.

1) Improvement of the method of separating the desired water-soluble multifunctional diazo compound from the reaction mixture after the completion of the synthesis reaction. In a method that has heretofore been published, the reaction mixture is poured into an organic solvent (such as isopropyl alcohol) in which the water-soluble multifunctional diazo compound is less soluble to precipitate the desired diazo compound, which is then separated and dried to a powder. This method requires recovery of the organic solvent used and, as a result, tends to increase pollution of the waste water.

2) The production of the photosensitive composition containing a diazo compound. Water-soluble multifunctional diazo compounds are usually supplied as powders. Because they tend to decompose when they adsorb moisture, commercial diazo compounds are stored in an extremely dry condition. The dried powder tends to scatter in the production of photosensitive compositions containing the diazo compounds, resulting in pollution of the work place and adverse effects on the workers' health. Therefore, a liquid or paste multifunctional diazo compound has been in demand.

SUMMARY OF THE INVENTION

The inventors have conducted intensive studies and found that these problems can be solved by forming the water-soluble multifunctional diazo compound as a liquid or paste composition using lactic acid, hydroxyacetic acid or both in an amount of at least one third of the weight of the diazo compound.

It has heretofore been known that, as solvents for making the water-soluble multifunctional diazo compound into a liquid or paste form, basic substances are inappropriate, while neutral or acid substances are suitable. In general, aromatic diazo compounds are known to be unstable in bases and stable in acids. As neutral substances, use of neutral organic solvents is worthy of being considered; however, according to investigations by the inventors, it has been found that no suitable substances for the objects of the present invention exist in the groups of solvents. For example, methyl alcohol, dimethylformamide, dimethylacetamide, hexamethylphosphortriamide, and N-methylpyrrolidone dissolve water-soluble multifunctional diazo compounds, but these compounds are liable to change in these solvents.

Typical acid substances are inexpensive inorganic acids such as hydrochloric acid, hydrobromic acid, nitric acid, sulfuric acid, phosphoric acid and the like. All of these substances dissolve the water-soluble multifunctional diazo compounds, but hydrochloric acid, hydrobromic acid, and nitric acid are unsuitable because they have strong smell, and nitric acid is undesirable because it has oxidizing properties. Since diazo compounds tend to decompose in concentrated sulfuric acid at room temperature, there is a possibility that medium-concentration sulfuric acid can be used as a medium for making the water-soluble multifunctional diazo compounds into a liquid or paste form.

There have heretofore been a few patents which handle a water-soluble multifunctional diazo compound in the form of liquid or paste to produce photosensitive compositions. For example, Japanese Patent Publication 38-11356/1963 or U.S. Pat. No. 3,235,384 reacts diphenylamine-4-diazonium salt with formaldehyde in phosphoric acid to obtain a viscous mixture having a high storage stability, and the mixture is used, as is, to obtain a photosensitive layer of photosensitive lithographic printing plates. However, when phosphoric acid is used as a solvent for liquid or paste formation as described above, depending on the type of polymer compound used in the photosensitive layer, the phosphoric acid may hinder the photo-curing of the photosensitive layer; thus, applications of the diazo compound formed into a liquid or paste with phosphoric acid are limited. Furthermore, U.S. Pat. No. 3,235,382 condenses diphenylamine-4-diazonium salt and formaldehyde in a strong acid such as sulfuric acid, hydrochloric acid, hydrobromic acid, alkylphosphoric acid, and organic sulfonic acid, and uses the resulting reaction paste mixture as is to obtain a photosensitive lithographic printing plate. However, such a diazo compound containing a large amount of strong acid tends to have adverse effects on aluminum plates or the like; hence the uses are also necessarily considerably limited and produce inferior results in application.

Suitable media for making the water-soluble multifunctional diazo compound into a liquid or paste-formed photosensitive composition are required to have the following properties:

1) Readily dissolving the water-soluble multifunctional diazo compound,
2) Low reactivity toward the water-soluble multifunctional diazo compound,
3) Liquid at room temperature,
4) Low toxicity and, if possible, harmless to human bodies,
5) Nearly odorless in the atmosphere at temperatures of below 100° C.,
6) Soluble in water,
7) Inexpensive.

The inventors have conducted further investigations on organic acid and found that lactic acid and hydroxyacetic acid meet the above conditions. Of these substances, lactic acid is more suitable for the objects of the present invention.

DETAILED DESCRIPTION OF THE INVENTION

Lactic acid is an α-hydroxy acid having asymmetric carbon atoms, and exists as a L-lactic acid, D-lactic acid, and DL-lactic acid. The commercial product is the DL-lactic acid; it has a melting point of 16.8° C., and is a colorless or light yellow, transparent, viscous liquid. This substance is highly hygroscopic, and the commercial product often contains 10% or more water. Lactic acid containing about 10% water does not freeze even at −20° C., is harmless to human bodies, is used as a food additive, and is odorless. According to studies by the inventors, it has been found that lactic acid containing 10 to 20% of water readily dissolves the water-soluble multifunctional diazo compound, and the water-soluble multifunctional diazo compound dissolved in lactic acid usefully maintains its photosensitivity even after being stored for an extended period of time at room temperature.

Hydroxyacetic acid has similar properties to lactic acid, and is suitable for maintaining diazo compound-containing photosensitive compositions in a liquid or paste form. Commercial hydroxyacetic acid generally contains 30% water, and has a melting point of 9 to 10° C. This product has been widely used for a long time for dyeing and tanning, is nearly odorless, has low toxicity, and is easy to handle. According to studies by the inventors, hydroxyacetic acid also readily dissolves water-soluble multifunctional diazo compounds and has a low reactivity toward the diazo compounds.

Since lactic acid and hydroxyacetic acid have hydroxyl and carboxyl groups in their molecules, they tend to autopolymerize due to their own esterification reaction. Commercial products of both acids contain some amounts of such polymers: however, the presence of such polymers has no adverse effect on the present invention. Thus, lactic acid or hydroxyacetic acid forming the photosensitive composition according to the present invention is not limited to a monomer of each acid, but includes the individual acid containing a polymer of the acid. Therefore, the terms lactic acid and hydroxyacetic acid as used in this Specification and Claims include the acids containing polymers formed by condensation due to autoesterification.

As described above, lactic acid, hydroxyacetic acid, or mixtures thereof are suitable for use as a medium to maintain the water-soluble multifunctional diazo compound in the form of liquid or paste with good storage stability. To further improve the storage stability, it has been found effective to add another acid which is more acid than lactic acid; i.e. has a larger acid dissociation constant (Ka).

There are many acids which are stronger in acidity than lactic acid, and most such acids are useful for the purposes of the present invention. Of these acids, the most suitable ones are sulfuric, trialkylamine hydrogensulfate, potassium hydrogensulfate, sodium hydrogensulfate, amidesulfuric, phosphoric, polyphosphoric, phosphonic (phosphorous), alkylsulfonics having 1 to 4 carbon atoms, benzenesulfonic, toluenesulfonic, benzenedisulfonic, toluenedisulfonic, citric, oxalic, tartaric, fumaric, phthalic, maleic, malic, and the like. The substance obtained by mixing lactic acid, hydroxyacetic acid, or a mixture thereof with at least one of the above acids is suitable for maintaining the water-soluble multifunctional diazo compound in a liquid or paste form, and the resulting diazo compound-containing photosensitive composition is superior in storage stability.

Furthermore, a solution containing alkylsulfonate of trialkylammmonium or tetraalkylammonium, mixed with lactic acid, hydroxyacetic acid, or a mixture thereof, is also suitable as a medium for maintaining the water-soluble multifunctional diazo compound in a liquid or paste form. Alkylsulfonic acid used for this purpose preferably has 1 to 8 carbon atoms. Of the various alkylsulfonic acids, methanesulfonic acid is quite inexpensive, easily available, and superior in performance. Suitable trialkylamine includes triethylamine, tripropylamine, and tributylamine, and suitable tetraalkylammonium hydroxide includes tetramethylammonium hydroxide, tetraethylammonium hydroxide and the like. A solution containing lactic acid, hydroxyacetic acid, or a mixture thereof, mixed with such an alkylsulfonate in an amount of 0.5 to 3 times the weight of hydroxycarboxylic acid, is particularly suitable as a medium for maintaining the water-soluble multifunctional diazo compound in a liquid or paste form.

For general applications, the amount of lactic acid, hydroxyacetic acid, or mixtures thereof in the photosensitive composition according to the present invention is preferably 1 to 5 times the weight of the diazo compound. However, in special cases, such as when a solution containing alkylsulfonate of trialkylamine or tetraalkylammonium hydroxide mixed with lactic acid or hydroxyacetic acid is used as a medium for making the diazo compound into a liquid or paste form, lactic acid, hydroxyacetic acid, or mixtures thereof may be used in an amount of at least ⅓ the weight of the diazo compound.

The diazo compounds of the present invention include all water-soluble aromatic diazo compounds having at least two diazo groups in the molecule. These multifunctional diazo compounds are classified by chemical structure into a) and b) shown below:

a) A multifunctional diazo compound obtained by combining two or more molecules of substituted diphenylamine, diphenylether, or diphenylsulfide carrying one diazo group of Formula (1) linked through an appropriate linking group:

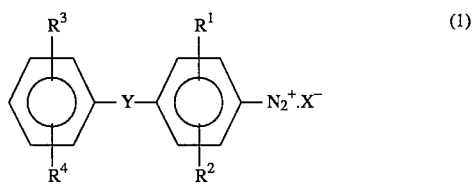

wherein X— denotes an anion formed by removing a proton from a protonic acid; Y denotes —NH—, —O—, or —S—; $R^1$, $R^2$, $R^3$ and $R^4$ denote hydrogen, alkyl having 1 to 4 carbon atoms, alkoxyl having 1 to 4 carbon atoms, or a linking group having a carboxyl or sulfonic acid group at a position which does not hinder the linkage of the linking group.

Typical compounds of Formula (1) include diphenylamine-4-diazonium salt. The multifunctional diazo compound obtained by linking the compound of Formula (1) with a linking group is obtained by reacting the compound of Formula (1) with, for example, a carbonyl compound or its equivalent such as formaldehyde, acetaldehyde, benzaldehyde, or acetone in a strong acid; or with a compound generating two or more carbocations in one molecule (for example, bismethoxymethyldiphenylether, hexamethoxymethylmelamine) in a strong acid. Examples are the multifunctional diazo compounds described in the following patents; U.S. Pat. Nos. 2,679,498, 2,922,715, 2,946,683, 3,050,502, 3,311,605, 3,163,633, 3,406,159, 3,277,074, Japanese Patent Publication 49-45323/1974, Japanese Patent Publication 54-9521/1979, Japanese Patent Publication Laid-open 62-156656, and Japanese Patent Publication Laid-open 2-3649.

b) A multifunctional diazo compound obtained by combining two or more 4-N,N-dialkylaminobenzene diazonium salt homologs having one diazo group of Formula (2) in the molecule through $R^7$ or $R^9$:

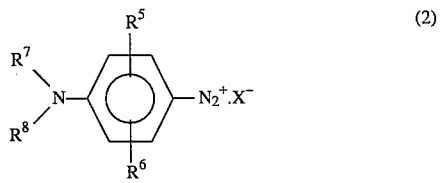

wherein X— denotes an anion formed by removing a proton from a protonic acid; $R^5$ and $R^6$ denote hydrogen, alkyl having 1 to 4 carbon atoms, or alkoxyl having 1 to 4 carbon atoms; $R^7$ and $R^8$ denote alkyl, alkylene, aralkyl, aralkylene, or its equivalents thereof. Specifically, examples are multifunctional diazo compounds described in the following patents; Japanese Patent Publication Laid-open 54-30121/1979, Japanese Patent Publication 54-9521/1979, Japanese Patent Publication 1-57332, Japanese Patent Publication Laid-open 2-3049, and Japanese Patent Application 153295/1991.

In the final production process of thereof, it is difficult to use water to separate the desired diazo compound from the reaction mixture. In general, the reaction mixture is poured into a large amount of water-soluble organic solvent (e.g. isopropyl alcohol) in which the diazo compounds have a low solubility, and the diazo compound is precipitated. Since the water-soluble diazo compound is liable to react with water and decompose, the compound must be completely dehydrated in order to improve storage stability.

Such a final production process makes commercial production of the water-soluble diazo compound difficult and increases the production cost. Therefore, it is a primary object of the present invention to eliminate this difficulty.

An example of the present invention will now be briefly described, although the detailed method will be shown in the embodiments. After the completion of the water-soluble diazo compound synthesis reaction, the reaction mixture is poured into a concentrated aqueous sodium chloride solution to separate the objective diazo compound in a semi-solid form; it is then washed with aqueous sodium chloride solution, and, without drying or pulverizing, mixed with an acid substance mainly comprising lactic acid and/or hydroxyacetic acid to obtain a liquid or paste. A diazo compound-containing photosensitive composition of good storage stability can be obtained by adequately controlling the quality and quantity of the acid substance.

The water-soluble multifunctional diazo compound and a hydrophilic polymeric compound, which by irradiation with light reacts with the diazo compound and becomes insoluble in water, are mixed with water to obtain an emulsion, and the emulsion is coated on a substrate and dried to yield a photosensitive composition. Such compositions are important for use in photosensitive printing plates and photosensitive color image formation materials. A photosensitive lithographic printing plate is obtained when a specially processed paper or a surface-roughened polyester film is used as a substrate of the photosensitive layer.

For example, a photosensitive screen printing plate is obtained when a screen made of nylon yarns, polyester yarns, or stainless steel fine filaments is used as a substrate. When the photosensitive emulsion is mixed with a coloring agent, coated on a transparent film and dried, a photosensitive composition for color image formation film is obtained. Of these photosensitive compositions, the one for screen printing is particularly important.

When a negative master plate is put on the photosensitive layer of these photosensitive compositions and irradiated with light, the diazo compound is decomposed by irradiation and links with the hydrophilic polymeric compound present to harden it and make it water-insoluble. The layer is then washed with water to obtain a positive image. Since the photosensitive compositions can be developed with water, they have obvious industrial advantages.

There have heretofore been found many types of hydrophilic polymeric compounds which are suitable for use in the photosensitive layer of these compositions. A typical emulsion comprises polyvinyl acetate, using polyvinyl alcohol as the protective colloid, mixed with an appropriate amount of an aqueous polyvinyl alcohol solution. All of these prior art hydrophilic polymeric compounds can also be used in the photosensitive layer of the photosensitive composition according to the present invention.

When the photosensitive layer of photosensitive printing plates or the like is formed of the water-soluble multifunctional diazo compound and a hydrophilic polymeric compound, the water-soluble diazo compound tends to react with water contained in the photosensitive layer and decompose. As a result, such a photosensitive printing plate is inferior in storage stability. The photosensitive layer must be freshly prepared every time the printing plate is used. Therefore, the water-soluble diazo compound must be handled every time the photosensitive layer is formed. Since water-soluble multifunctional diazo compounds currently available in the market are extremely dry powders, they tend to scatter during handling. Scattered yellow diazo compound contaminates the work place and, with the passage of time, decomposes further into dark-colored contaminating substances. Since the diazo compound is highly reactive, the scattering tends to have adverse effects on the workers' health. For such reasons, development of a photosensitive composition containing a liquid or paste-formed water-soluble multifunctional diazo compound, which has excellent storage stability and is easy to handle, is in demand.

The present invention meets these requirements. Compared to the above powder-formed diazo compounds, the photosensitive composition containing the liquid or paste-formed diazo compound according to the present invention is far easier to handle, and has many other advantages. The photosensitive printing plate produced according to the present invention contains an acid substance mainly comprising lactic acid or hydroxyacetic acid. Since the acid substance is a stabilizer for the water-soluble diazo compound, the photosensitive layer of the photosensitive printing plate produced using it is far better in storage stability than the photosensitive layer using the prior art diazo powders.

As described above, a preferred application for the photosensitive composition is as a photosensitive material for a screen printing plate, which will be described further in detail.

The diazo compound-containing photosensitive composition according to the present invention and a water-soluble resin (e.g. polyvinyl alcohol, styrylpyridinium group containing polyvinyl alcohol) are mixed to obtain a screen printing photosensitive solution. To these ingredients, polyvinyl acetate emulsion or a vinyl monomer such as an alcohol monoacrylate, diacrylate, or triacrylate may be added. This photosensitive composition is coated on a screen mesh comprising a synthetic resin such as polyester, nylon, polystyrene, or these resins deposited with a metal such as nickel, or stainless steel, and dried. This procedure can be repeated to obtain a screen printing plate of 10 to 400μm in thickness. The photosensitive composition according to the present invention is good in storage stability and provides a screen printing plate having a high ink resistance.

Another preferred application for the photosensitive composition according to the present invention is for a color image formation material.

The transparent substrate used for the photosensitive composition can be a transparent plastic film of polyethyleneterephthalate, polypropylene, polyethylene, polyvinyl chloride, polystyrene, polycarbonate, cellulose triacetate, or the like. The film-forming water-soluble polymeric substance which is rendered insoluble by irradiation with light and can be developed with water alone includes a variety of substances such as polyvinyl alcohol, gelatin, casein, glue, alginic acids, gums, cellulose derivatives such as carboxymethyl cellulose and hydroxyethyl cellulose, polyacrylic acid and its salts, polymethacrylic acid and its salts, polyacrylamide, polyethyleneoxide, polyvinylpyrrolidone and the like. The coloring agent can be selected from pigments which are dispersible in water. Alternatively, water- or alcohol-soluble dyes can be used. In addition to the above constituents, the layer which is insolubilized by irradiation with light may be mixed with a stabilizer as needed to prevent dark reaction, and a leveling agent, defoamer, and a surfactant for improving the formation of the color layer on the transparent substrate may also be included. In the formation of the colored layer, the above constituents are dissolved or dispersed in water and mixed. In this case, for defoaming or improvement to the applicability, water-soluble organic solvents such as alcohols may be used as diluents. The thickness of the color layer is preferably as small as possible to achieve the best resolution in the form of gradation reproducibility, but preferably as large as possible for the best dyeability: it is optimally 2 to 5μm as a compromise. The color layer may be coated directly on the transparent substrate, but it is advantageous to provide an intermediate layer in order to improve the adhesion. In particular, the color layer according to the present invention tends to have insufficient adhesion when a polyethylene terephthalate film is used as the substrate. As the intermediate layer, it is particularly preferable to provide a synthetic resin such as polyester, polyvinylidene chloride, or polyurethane. The method for coating the color layer and the intermediate layer on the transparent substrate is not specifically limited, and prior art methods may be used which can give a uniform coating film with no pinholes. The light sources used for exposure of the photosensitive composition can be any of those which effectively insolubilize the photosensitive layer, e.g. various mercury lamps, carbon arc lamps, xenon lamps, metal halide lamps, fluorescent lamps, or the like.

In addition, photosensitive compositions according to the present invention which also contain a hydrophilic or hydrophobic binder resin can be widely used in applications in which the compositions are exposed and developed to form patterns. Furthermore, these photosensitive compositions can be used by being mixed with coloring materials such as dyes or pigments. Such applications include photoresist materials, photomasks, proof-correction materials, and secondary master copies.

DESCRIPTION OF THE PREFERRED EMBODIMENTS

EXAMPLE 1

[Photosensitive Composition]

Diphenylamine-4-diazonium hydrogensulfate in an amount of 29 g was dissolved in 100 g of concentrated sulfuric acid under ice cooling, mixed with 2.4 g of paraformaldehyde at 5 to 8° C. with stirring, stirred at 8° C. for 2 hours, and the reaction mixture was poured into 400 g of 20% aqueous sodium chloride solution at 5° C. with stirring to deposit a rice cake shaped diazo condensate. The supernatant layer was removed, the product was washed with 20% aqueous sodium chloride solution at 5° C., and the supernatant solution was removed. The washing procedure was repeated twice to solidify the product. The solid diazo condensate was dissolved in 46 g of 98% lactic acid and 1 g of 98% sulfuric acid to obtain 78 g of Photosensitive Composition 1.

An aqueous solution of Photosensitive Composition 1 had a λmax of UV absorption at 374 nm and an absorption coefficient at λmax of 30.8. The Composition retained its photosensitivity after extended storage at room temperature.

EXAMPLE 2

[Photosensitive Composition]

Diphenylamine-4-diazonium hydrogensulfate in an amount of 29 g was dispersed in 80 g of dichloromethane, and 20 g of methanesulfonic acid was added with stirring. This mixture was mixed with 3 g of paraformaldehyde little by little so that the temperature did not exceed 25° C. After stirring at room temperature for 4 hours and at 40° C. for 10 hours, 25 g of 90% lactic acid was added, 19 g of triethylamine was added dropwise to the reaction mixture, and dichloromethane removed under vacuum to obtain 95 g of a dark yellow-brown viscous Photosensitive Composition 2.

0.0200 g/liter of an aqueous solution of Photosensitive Composition 2 had a $\lambda$max of UV absorption at 376.0 nm and an absorbance of 0.670. Calculating from this value, the composition had an absorption coefficient at 376 nm of 33.5. The composition retained its photosensitivity after storage at 30° C. for several months.

EXAMPLE 3

[Photosensitive Composition]

p-Aminoacetanilide in amount of 45 g was dissolved in 200 g of acetic acid, 58 g of phenol novolac polyglycidylether having an epoxy equivalent of 175 was added in limited amounts with stirring, stirring was continued at 30° to 35° C. for 8 hours, 32 g of glycidylmethylether having an epoxy equivalent of 100 was added and stirred at 35° to 40° C. for 8 hours. A mixture of 62 g of 95% sulfuric acid and 65 g of water was added, and stirred at 70° to 76° C. for 12 hours to complete the deacetylation reaction. The reaction mixture was cooled to 3° to 5° C., and 22 g of sodium nitride dissolved in 50 g water was dropped in with stirring at the same temperature to carry out the diazotization. The reaction mixture was poured with stirring into 1,500 g of 20% aqueous sodium chloride solution at 5° C. to deposit a rice cake shaped diazo compound. The result was washed with 20% aqueous sodium chloride solution as in Example 1 to obtain a yellow solid. This undried solid diazo compound was dissolved in a mixture of 200 g of 98% lactic acid and 5 g of methanesulfonic acid to obtain 363 g of Photosensitive Composition 3.

An aqueous solution of this composition had a $\lambda$max of UV absorption at 378.5 nm, and the composition had an absorption coefficient of 15.7. Photosensitive Composition 3 retained a practical photosensitivity after storage at room temperature for about one year. The main ingredient of the diazo compound of this Example is shown in Formula (3) below:

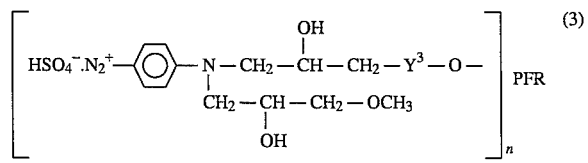

(3)

wherein n is an integer from 2 to 10; PFR denotes a phenol-formaldehyde condensate group from which n units of phenolic OH group are removed; and $Y^3$ does not exist or denotes a divalent group derived from a lower condensate of epichlorohydrin and phenol-formaldehyde condensate.

EXAMPLE 4

[Photosensitive Composition]

Under nearly the same conditions as in Example 3, 4-N-cyanoethylaminoacetanilide and phenol novolac polyglycidylether were reacted in an acetic acid medium, the reaction product was mixed with dilute sulfuric acid, stirred to hydrolyze the cyano group to a carboxyl group and to deacetylize the acetylamino group. The resulting product was then diazotized by adding sodium nitrite using a conventional method, and poured into 20% aqueous sodium chloride solution; the resulting solid was vacuum-dried to obtain a powder of a multifunctional diazo compound having the structure of Formula (4) below:

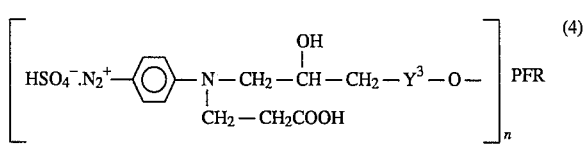

(4)

wherein n, PFR, and $Y^3$ are the same as those in Formula (3).

80 g of this multifunctional diazo compound was dissolved in a mixture of 240 g of 70% hydroxyacetic acid, 4 g of p-toluenesulfonic acid hydrate, and 2 g of 95% sulfuric acid to obtain 326 g of a Photosensitive Composition 4. This composition retained a practical photosensitivity after storage at room temperature for about one year.

EXAMPLE 5

[Photosensitive Composition]

According to the method described in Example 1 of Japanese Patent Publication 54-9521/1979, 3-methoxydiphenylamine-4-diazonium hydrogensulfate and 4,4'-bis-methoxymethyldiphenylether were condensed in phosphoric acid, and then converted to a methanesulfonic acid salt to obtain a powder of a multifunctional diazo compound. 10 g of this compound was mixed into an acid substance comprising a mixture of 20 g of 90% lactic acid, 12 g of 70% hydroxyacetic acid, and 8 g of methanesulfonic acid, and stirred to obtain a Photosensitive Composition 5. This composition retained a practical photosensitivity after extended storage at room temperature.

Comparative Example 1

[Synthesis of condensate of diphenylamine-4-diazonium salt and formaldehyde]

Diphenylamine-4-diazonium hydrogensulfate in an amount of 14.5 g (0.05 mole) was dissolved in 50 g of concentrated sulfuric acid under ice cooling, 1.2 g (0.04 mole) of paraformaldehyde was slowly added at 5° to 8° C., and stirring continued at 8° C. for 2 hours. The mixture was dropped into 200 g of ice-cooled isopropylalcohol at about 5° C., and the resulting precipitate was filtered, washed three times with cold isopropylalcohol, and vacuum dried. The yield was 11g.

EXAMPLE 6

[Photosensitive Screen Printing Plate 1]

| Formulation of Photosensitive Solution (1) | |
|---|---|
| Photosensitive Composition 1 (prepared in Example 1) | 1.1 g |
| Water | 3.9 g |
| <Direct Photo Emulsion Diazo Type SP-1700H> (Murakami Screen) | 45.0 g |

Photosensitive Solution (1) obtained from the above formulation was coated using a bucket on a 250-mesh monofilament polyester screen stretched on an aluminum frame. The coating and hot air drying at 40° C. for 10 minutes were repeated 4 or 5 times to obtain a photosensitive film with a thickness of 70 μm (including the screen).

A negative transparent master plate was put on the screen photosensitive plate, and exposed by a 4-kW ultra-high pressure mercury lamp (Oak Seisakusho) from a distance of 1 m for 2 minutes. Washing development of the image was carried out as follows:

The exposed screen photosensitive plate was immersed in 25° C. water for 1 minute to dissolve out a greater part of unexposed portion, and 20° C. water was blown under a pressure of 6 kg/cm² through a spray gun from a distance of 30 cm to completely remove residual photosensitive films from the image portion to obtain a Photosensitive Screen Printing Plate 1.

For comparison, 0.35 g of the diphenylamine-4-diazonium salt/formaldehyde condensate synthesized in Comparative Example 1 was dissolved in 4.65 g of water and, using the same <Direct Photo Emulsion> as above, a comparative sample of screen printing plate was prepared using the same procedure.

Comparing both plates, it was confirmed that the same results were obtained in terms of sensitivity and water and solvent resistance as with the prior art plates. Printing was normally carried out using the plates with no damage to the image and with consistent printing reproducibility.

EXAMPLE 7

[Photosensitive Screen Printing Plate 2]

| Formulation of Photosensitive Solution (2) | |
| --- | --- |
| Photosensitive Composition 2 (prepared in Example 2) | 1.0 g |
| Water | 4.0 g |
| <Direct Photo Emulsion Diazo Type SP-1700H> (Murakami Screen) | 45.0 g |

Using the photosensitive solution (2) obtained from the above formulation, Photosensitive Screen Printing Plate 2 was obtained using the procedure of Example 6. Photosensitive Screen Printing Plate 2 had the same properties as the sample of the photosensitive screen printing plate prepared for comparison in Example 6.

EXAMPLE 8

[Photosensitive Screen Printing Plate 3]

| Formulation of Photosensitive Solution (3) | |
| --- | --- |
| Photosensitive Composition 3 (prepared in Example 3) | 1.6 g |
| Water | 3.4 g |
| <Direct Photo Emulsion Diazo Type SP-1700H> (Murakami Screen) | 45.0 g |

Photosensitive Solution (3) was coated on a screen and dried as in Example 6 to obtain a Photosensitive Film (3). Photosensitive Film (3) was far superior in terms of storage stability compared to a comparative sample of photosensitive film obtained from the multifunctional diazo compound synthesized in Comparative Example 1 using the same method. Photosensitive Film (3) was exposed and developed as in Example 6 to obtain a photosensitive screen printing plate which had a high sensitivity and was superior in water and solvent resistance.

EXAMPLE 9

[Color image formation photosensitive material]

An example of preparation of photosensitive film for image formation is shown below:

| a) Formulation of intermediate layer forming solution | |
| --- | --- |
| Vinylchloride-vinylidene chloride copolymer (40% solution) (Kureha Kagaku: Kurehalon SOA) | 10.0 g |
| Toluene | 45.0 g |
| Ethyl acetate | 45.0 g |
| b) Formulation of color layer forming solution | |
| Photosensitive Composition 4 (prepared in Example 4) | 4.0 g |
| Polyvinylalcohol (average polymerization degree: 1700, 88% hydrolysis) | 100.0 g |
| Pigment dispersion (Phthalocyanine Blue 20% solution) | 4.0 g |
| Water | 100.0 g |
| Isopropyl alcohol | 100.0 g |

The intermediate layer forming solution was coated by a bar coater on one side of a 100 μm biaxially-oriented polyethylene terephthalate film, and dried at 100° C. for 1 minute to form an intermediate layer about 1 μm thick. On top of the intermediate layer, the colored layer forming solution was coated by a bar coater to a thickness of 3 μm after drying, and dried in an air-blow dryer at 80° C. for 1 minute to obtain a cyan-colored Photosensitive Film I.

A negative plate (color-divided negative screen-for cyan plate) was put on the color photosensitive surface of Film I, and exposed by a 1-kW metal halide lamp from a distance of 70 cm for 2 minutes. The non-image portion was washed out with room temperature water blown from a nozzle pressurized to 1 kg/cm², dewatered, and hot air dried at 50° C. to obtain a positive cyan image.

The positive cyan image of the diazo compound according to the present invention had pure tints specific to the coloring agent due to less coloring of residual substances after exposure compared to one prepared using the diazo compound/formaldehyde condensate synthesized in Comparative Example 1.

The present invention provides the following advantages:
1) The production of the water-soluble multifunctional diazo compound is improved to produce a diazo compound-containing photosensitive composition in a liquid or paste form. 2) The liquid or paste photosensitive composition according to the present invention is easy to handle and can improve the process of production of photosensitive printing plates and the like. 3) The photosensitive composition according to the present invention has good storage stability.

We claim:

1. A liquid or paste photosensitive composition comprising an admixture of a water-soluble aromatic diazo compound having at least two diazo groups, and a substance selected from the group consisting of lactic acid, hydroxyacetic acid, and mixtures thereof, in an amount, by weight, greater than one third the weight of said diazo compound, said water-soluble aromatic diazo compound being selected from the group consisting of:
(a) a multifunctional diazo compound obtained by combining at least two molecules of substituted diphenyl amine, diphenyl ether, or diphenyl sulfide having one diazo group, as represented by Formula (1), linked through an appropriate linking group;

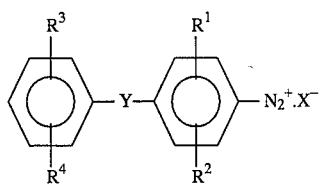

wherein $X^-$ denotes an anion formed by removing a proton from protonic acid; Y denotes —NH—, —O—, or —S—; and $R^1$, $R^2$, $R^3$, and $R^4$, are hydrogen, alkyl having 1 to 4 carbon atoms, or alkoxy having 1 to 4 carbon atoms; and a multifunctional diazo compound obtained by combining at least two 4-N,N-dialkylaminobenze diazonium salt homologs having one diazo group, as represented by Formula (2), attached through $R^7$ or $R^8$;

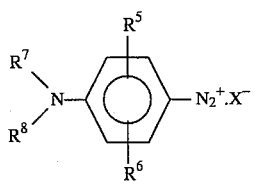

wherein $X^-$ denotes an anion formed by removing a proton from protonic acid; $R^5$ and $R^6$ denote hydrogen, alkyl having 1 to 4 carbon atoms, or alkoxy having 1 to 4 carbon atoms; and $R^7$ and $R^8$ denote alkyl, alkylene, aralkyl, or aralkylene.

2. The photosensitive composition of claim 1 further comprising a salt of an alkylsulfonic acid having 1 to 8 carbon atoms, and a trialkylamine having 3 to 12 carbon atoms or a tetraalkylammonium hydroxide having 4 to 16 carbon atoms, in an amount, by weight, of 0 to 4 times a weight of said lactic acid, hydroxyacetic acid, and mixtures thereof.

3. The photosensitive composition of claim 2 further comprising an acid substance selected from the group consisting of sulfuric acid, trialkylamine hydrogen sulfate, potassium hydrogen sulfate, sodium hydrogen sulfate, amidesulfuric acid, phosphoric acid, polyphosphoric acid, phosphonic acid, alkylsulfonic acid having 1 to 4 carbon atoms, benzene sulfonic acid, toluene sulfonic acid, benzene disulfonic acid, toluene disulfonic acid, citric acid, oxalic acid, tartaric acid, fumaric acid, phthalic acid, maleic acid, and malic acid, said acid substance being present in an amount of 0.005 to 0.5 mols per mol of said lactic acid, hydroxyacetic acid, and mixtures thereof.

4. The photosensitive composition of claim 1 further comprising an acid substance selected from the group consisting of sulfuric acid, trialkylamine hydrogen sulfate, potassium hydrogen sulfate, sodium hydrogen sulfate, amidesulfuric acid, phosphoric acid, polyphosphoric acid, phosphonic acid, alkylsulfonic acid having 1 to 4 carbon atoms, benzene sulfonic acid, toluene sulfonic acid, benzene disulfonic acid, toluene disulfonic acid, citric acid, oxalic acid, tartaric acid, fumaric acid, phthalic acid, maleic acid, and malic acid, said acid substance being present in an amount of 0.005 to 0.5 mols per mol of said lactic acid, hydroxyacetic acid, and mixtures thereof.

* * * * *